(12) United States Patent
Dirkers et al.

(10) Patent No.: US 6,443,768 B1
(45) Date of Patent: Sep. 3, 2002

(54) SMALL FORM FACTOR CONNECTOR CAGE

(75) Inventors: Christopher P. Dirkers, Calico Rook; Dennis Lee Doye, Maumelle, both of AR (US); Hazelton P. Avery, Batavia, IL (US); Jay H. Neer, Boca Raton, FL (US); William A. Russell, Jr., Maumelle, AR (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/952,541

(22) Filed: Sep. 14, 2001

(51) Int. Cl.⁷ .............................................. H01R 13/648
(52) U.S. Cl. ........................................ 439/607; 439/567
(58) Field of Search ................................ 439/696, 607, 439/567

(56) References Cited

U.S. PATENT DOCUMENTS

| | | | | |
|---|---|---|---|---|
| 4,689,723 A | * | 8/1987 | Myers et al. ............... 439/607 |
| 5,017,156 A | * | 5/1991 | Sugiyama .................... 439/607 |
| 5,281,169 A | * | 1/1994 | Kiat et al. .................... 439/607 |
| 5,660,558 A | * | 8/1997 | Osanai et al. ............... 439/607 |
| 5,879,193 A | * | 3/1999 | Thenaisie et al. ........... 439/607 |
| 6,062,893 A | * | 5/2000 | Miskin et al. ............... 439/607 |
| 6,095,862 A | * | 8/2000 | Doye et al. .................. 439/607 |
| 6,364,709 B1 | * | 4/2002 | Jones ........................... 439/607 |

* cited by examiner

Primary Examiner—Renee Luebke
Assistant Examiner—Briggitte R. Hammond
(74) Attorney, Agent, or Firm—Thomas D. Paulius

(57) ABSTRACT

An improved EMI shield assembly for transceivers is provided in the form of a metal shielding cage that has interengaging cover and base portions. The cover portion has two sidewalls that include leading edges that flare outwardly so that the cover portion sidewalls ride up and over the sidewalls of the base portion. Catches are formed in the base portion sidewalls that have curved surfaces which engage the flared portions to further facilitate the assembly of the shielding cage assembly.

20 Claims, 4 Drawing Sheets

SMALL FORM FACTOR CONNECTOR CAGE

BACKGROUND OF THE INVENTION

The present invention relates generally to connector cages, or adapter frames that provide protection and shielding from electromagnetic interference ("EMI").

Many different types of connector adapter frames are known in the art. Some adapter frames, such as that described in U.S. Pat. No. 6,062,893, issued May 16, 2000 utilize both metal and plastic components and are intended to function entirely as a connector, others, such as those described in U.S. Pat. No. 6,095,862, issued Aug. 1, 2000 are formed entirely out of metal so as to provide EMI shielding. This type adapter frame uses a diecast metal body and a stamped, sheet metal cover. It is difficult to obtain a reliable fit with such a structure and due to the relatively large size of the die cast body, this type of frame cannot be mounted in a "belly-to-belly" fashion on opposite sides of a circuit board that may support the transceiver and other components. It is further difficult to form chassis and covers members of this style construction which snap-fit together in an easy manner.

The present invention is directed to an improved adapter frame having a structure that overcomes the aforementioned disadvantages.

SUMMARY OF THE INVENTION

Accordingly, it is a general object of the present invention to provide an improved shielding cage for transceivers and other components that is easier to assemble and which can be stacked on opposite sides of a circuit board.

Another object of the present invention is to provide an adapter frame for enclosing a transceiver component which provides EMI shielding to the transceiver, the frame including a metal base component and a metal cover component that securely engage each other when assembled together to prevent undesired lateral movement between the chassis and cover, the cover component having flared edges that ride up and over retention tabs formed in the base component.

A further object of the present invention is to provide an improved shielding cage having a chassis member with a structure that facilitates the mounting of two such shielding cages in a "belly-to-belly" orientation on opposite sides of a circuit board, the chassis having alternating board-engaging posts and slots formed therein along selected sides of the chassis such that the posts of one-chassis are received within the slots of the other chassis, thereby providing the piggybacked arrangement with a small form factor These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

Figure 1:
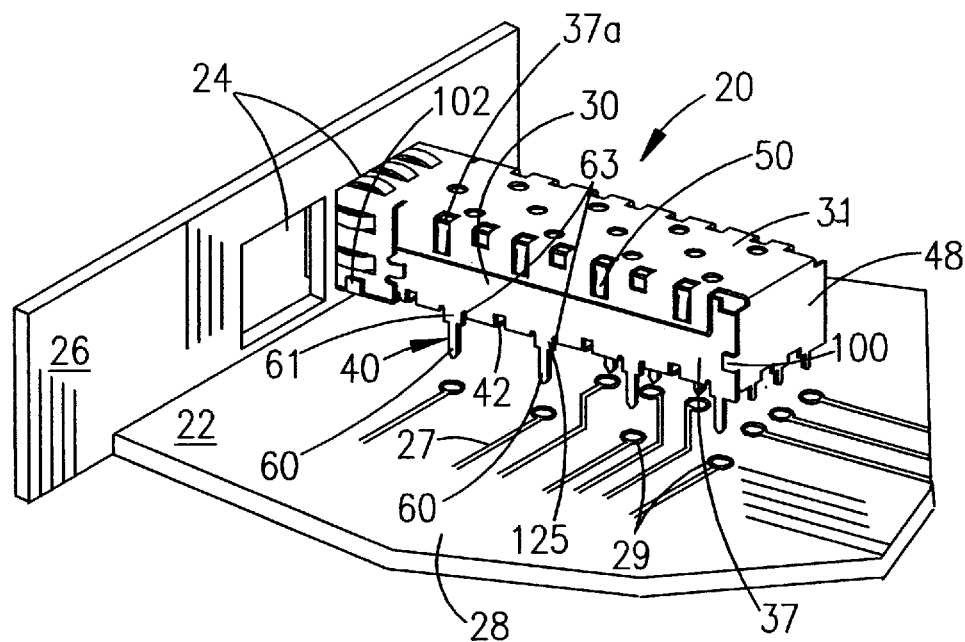
FIG. 1 is a perspective view of a shielding case assembly constructed in accordance with the principles of the present invention illustrated in place with a mounting panel and in opposition to a printed circuit board.

FIG. 1 illustrates a shielding cage assembly 20 constructed in accordance with the principles of the present invention; aligned with a circuit board 22 and in place within an opening 24 of a panel 26. Although the primary purpose of the shielding cage assembly 20 is to provide shielding from electromagnetic radiation and interference ("EMI"), the cage assembly does provide a measure of protection to the transceiver and its associated components from damage or contact when a device in which the cage assembly is used is worked on. The circuit board 22 has a series of conductive traces 27 formed in its upper surface 28 that extend from holes, or vias 29, formed in the board to various circuit areas (not shown).

The shielding cage assembly 20 is typically used to house a removable transceiver component (not shown), which is commonly used to convert pulses of light to electrical signals, and may be referred to in the art as a small form factor pluggable interface connector (SFP).

There are many problems associated with shielding cages in the art. Effective shielding is one problem, stacking the cages on opposite sides of the circuit board is another and assembly of the cages is still another problem. In order to provide effective EMI shielding, the cover of the cage assembly must securely engage the chassis, or base portion, of the shielding cage in a manner such that metal-to-metal contact is made. When a designer wants to position two transceivers on opposite sides of a circuit board, he must take into account the mounting pattern of the associated shielding cages and offset them so that the cages may be mounted to a circuit board. This may compromise the overall design of the circuit board. Lastly, the covers of such cages or adapter frames may be assembled by an automated assembler. In such instances, care must be taken to ensure that the edges of the cover and chassis components are aligned to prevent one from stubbing itself on the other when the two components are assembled together. Additionally, in "belly-to-belly" installations, care must be taken to ensure that the mounting pins of the two chassis components are inserted into the assigned mounting holes on the circuit board (which mounting holes are typically plated through holes) and they do not interfere with the mounting pins on the chassis component mounted to the opposite side of the circuit board. The present invention utilizes a unique structure that overcomes these problems and is believed to provide improved shielding and assembly benefits.

The shielding cage assembly 20 typically includes two interengaging pieces, a chassis or base component 30 and a cover component 31. The chassis component 30 is illustrated in plan view in FIG. 2 and has a general U-shaped configuration when viewed from the front or rear ends, 32, 33 respectively. As such, the chassis component 30 typically includes three sides, or walls: a base or bottom wall 35 and two sidewalls 36, 37 that extend upwardly from the base wall 35 and which are spaced apart from each other to define a channel 38 therebetween, into which fits a transceiver (not shown).

The shielding cage chassis component 30 is preferably stamped and formed from sheet metal and is provided with mounting pin portions 40 that are stamped out of the bottom wall 35 of the chassis component 30 and formed, or bent, so that they extend vertically with respect to the bottom wall 35, and preferably in the same plane as the sidewalls 36, 37. Notches 42, the purpose and function of which will be explained below in greater detail, are formed in the chassis component 30 in the general area where the sidewalls 36, 37 and bottom wall 35 meet. In the embodiment illustrated in FIGS. 1 and 2, this notch 42 extends in two planes, i.e., is formed partly in the chassis bottom wall 35 and partly in the sidewalls 36, 37. The mounting pin portions 40 are formed in a desired pattern to engage and mate with corresponding mounting holes 29 on the circuit board. The cage chassis component 30 also includes a plurality of retaining elements, or catches 50 that may be formed in the sidewalls 36, 37 thereof.

The cage cover 31 is also preferably formed from a sheet metal, although it and the cage chassis may be formed of other conductive materials, such as metal plated plastic or the like. The cover component 31 preferably has a length that matches a corresponding length of the chassis component 30 and also has a width that is preferably equal to or greater than a corresponding width of the chassis component 30. It is bent, as illustrated, into a general U-shaped configuration when looking at it from its front end 44. In this fashion, it includes top wall 45, two side walls 46, 47 and a rear wall 48.

Each of the sidewalls 46, 47 includes at their outer edges 46a, 47a thereof, elongated flared portions 49 that extend outwardly at an angle from the cover sidewalls 46, 47 (and also relative to the chassis component sidewalls 36, 37). This flared portion 49 extends for the entire length of the sidewalls 46, 47 of the cover component 31. These are the portions of the cover component 31 that facilitate the engagement of the chassis and cover components 30, 31. The angled surface presented by these flared portions 49 presents a width of the cover component 31 that is greater than that of the chassis component 30 so that the angled surfaces form lead-in edges for the length of the cover component sidewalls that will ride over the upper edges of the chassis component sidewalls and also up and over the retaining elements 50 formed in the chassis component 30. The flared portions 49 may be considered as forming lead-ins that extend along the leading edges of the side walls 46, 47. These lead-ins contact the chassis component 30 first when the cover component 31 is placed in the chassis component 30.

The flared portions 49 facilitate the assembly of the shielding cage 20 by engaging the leading, or top, edges of the chassis component sidewalls 36a, 37a. The outward angle of these flared portions 49 reduces the likelihood of stubbing from occurring between the leading edges of both the cover and chassis components. The flared portions 49 also help the cover component sidewalls 46, 47 to flex, or move, slightly outwardly when contact is made between them and the chassis component sidewalls 36, 37. This contact "ramps" the cover component sidewalls outwardly but also may ramp the chassis component sidewalls inwardly.

Figure 2:
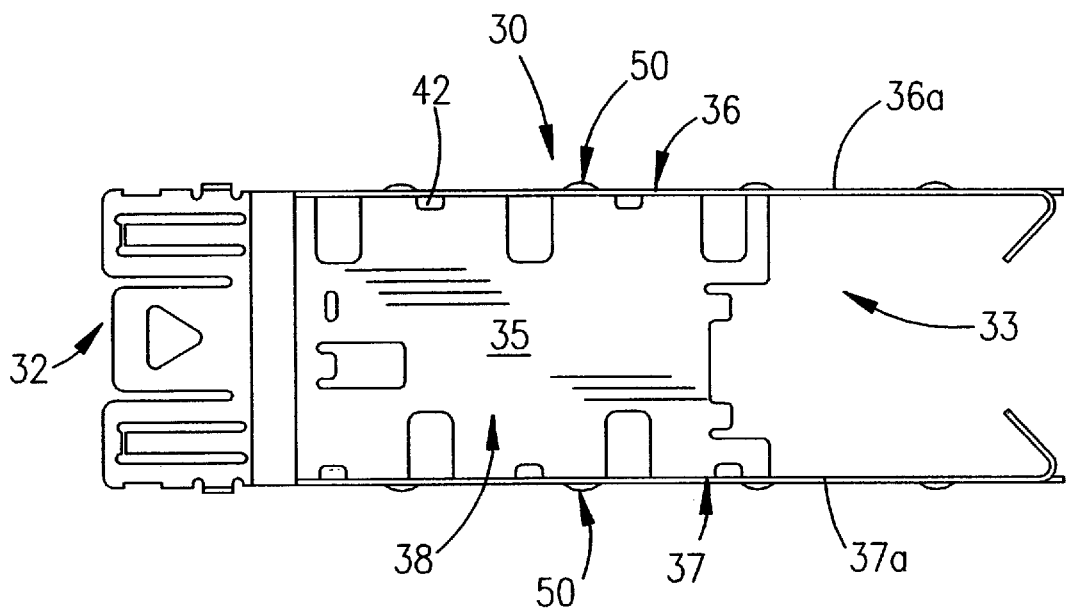
FIG. 2. Is a top plan view of one embodiment of a cage chassis used in the assembly of FIG. 1.

The cover component 31 further includes notches, or slots 51 formed in the sidewalls 46, 47 thereof. These slots 51 are located within the cover component 31 in alignment with the chassis component retaining elements 50 (FIGS. 1 and 2). Preferably, the slots 51 are dimensional slightly larger than the retaining elements 50, so that when the cover and chassis components are engaged together each slot 51 encompasses its corresponding retaining elements 50. In this regard, each such slot 51 is paired with a single retaining element 50 and the two components cooperate to not only facilitate engagement between the two, but also to retain the cover component 31 in place upon the chassis component 30.

Figure 9:
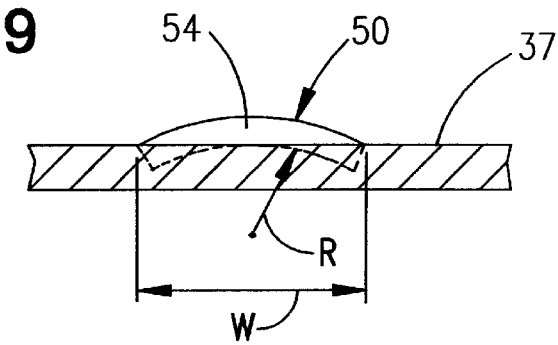
FIG. 9 is a sectional view of FIG. 7, taken along lines 9—9 thereof and locating upwardly.

The retaining element 50 have a unique shape that contributes to benefits derived from the present invention. A single retaining element 50 is shown in enlarged detail in FIG. 6. As illustrated, the retaining element 50 is formed by stamping it in the chassis component sidewalls 36, 37. The stamping is preferably accomplished by stamping a U-shaped opening 52 that defines both the width and length or (or height) of the retaining element 50. The retaining elements 50 are stamped on an outward radius R so that they present a rounded configuration, or surface 55 across their width W. This arcuate surface tapers down along the vertical plane of the cover component sidewalls at the location "Q", where the retaining element 50 meets the sidewall and the curvature is greatest at the free end 54 of the retaining element 50. The curved surface 55 cooperates with the flared portions 49 to further facilitate the application of the cover component 31 to the chassis component the curvature of the retaining element extends horizontally so that, as illustrated in FIG. 9 a curved engagement shoulder 56 that extends outwardly (typically perpendicularly to the vertical plane of the chassis component sidewalls 36, 37. Additionally, corner, or edges, 57 of the retaining element free end 54 preferably remain within the opening 52 surrounding the retaining element 50. This is best illustrated in FIG. 9.

Figure 3:
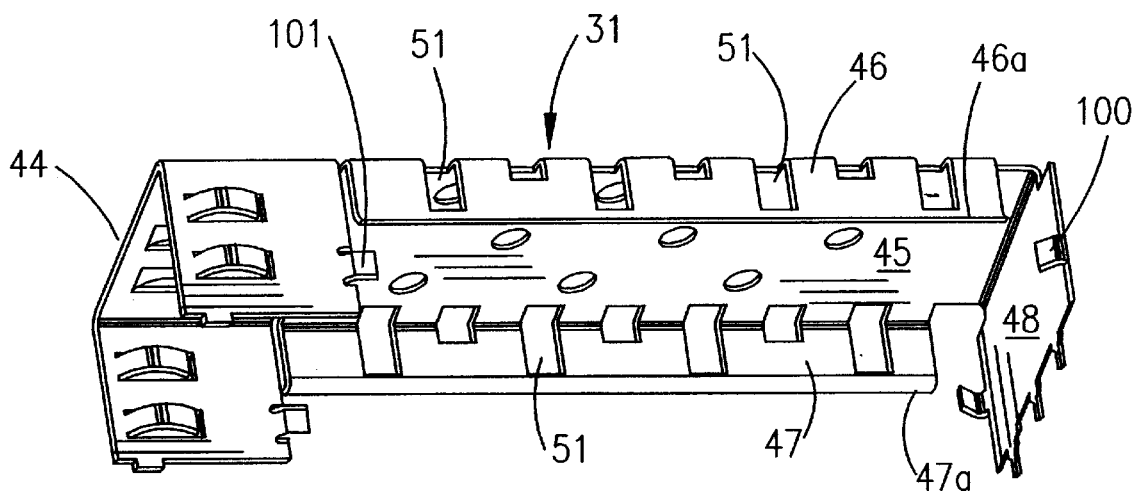
FIG. 3 is a perspective view of a shielding cage cover, taken from underneath the cover, used in the assembly of FIG. 1.
Figure 5:
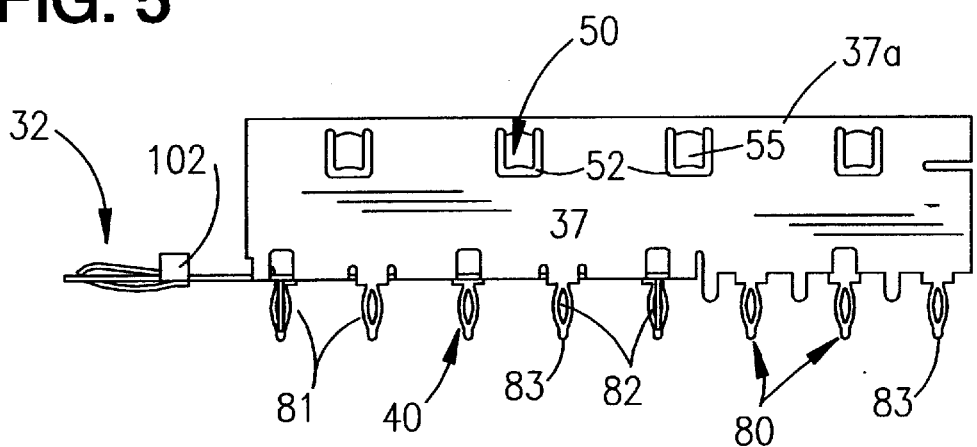
FIG. 5 is a side elevational view of a third embodiment of a shielding cage chassis constructed in accordance with the principles of the present invention.
Figure 6:
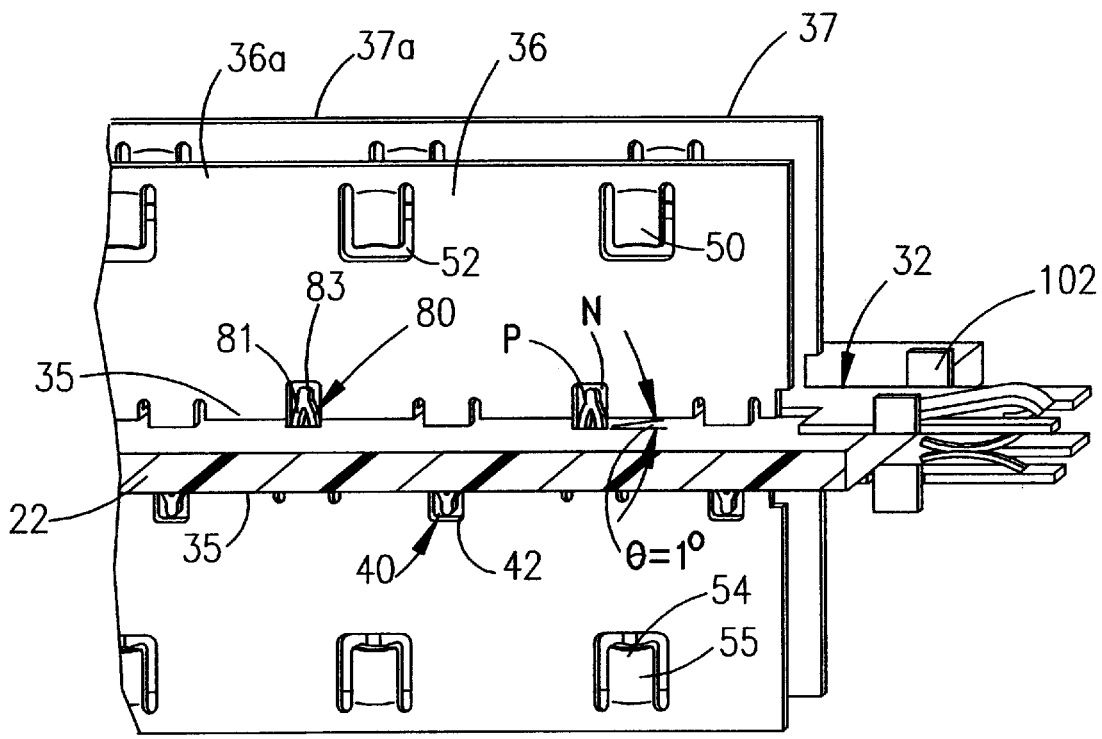
FIG. 6 is a side elevational view, partly in section, illustrating the placement of two shielding cage chassis illustrated in FIG. 5 in place in a "piggyback" fashion on opposite sides of a circuit board.
Figure 7:
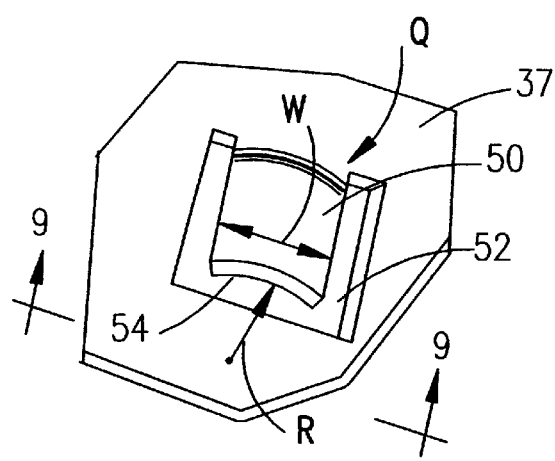
FIG. 7 is an enlarged detail view of a retainer element used on the shielding cage chassis, illustrating the curvature thereof.
Figure 8:
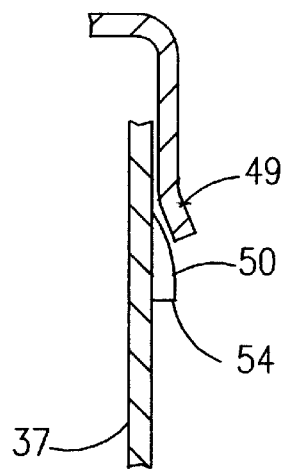
FIG. 8 is a partial sectional view of the shielding cage cover partially in place upon a corresponding chassis, illustrating the cooperation of the retainer element and the cage cover flange.

In order to further facilitate the assembly of the cover and chassis components 31, 30 together, the cover component 31 and the chassis component 30 may have soldering tabs formed therewith which extend over and into contact with their opposing components. These tabs are illustrated in the Figures, with the soldering tabs 100 that are formed on the endwall 48 of the cover component 31 and those 101 formed on the front part of the cover component being visible in FIGS. 1 & 3, while the soldering tabs 102 that are formed on the chassis component 30 near the front thereof, are best shown in FIGS. 1, 5 & 6. In this manner, the cover component 31 is preferably soldered to the chassis component 30 at the front and rear of the shielding cage assembly using the tabs 100 & 101, and if necessary the tabs 102 disposed at the front of the assembly 20.

In another important aspect of the present invention, the mounting pin portions 40 are staggered in their spacing along the lower edge of the chassis component sidewall with the notches 42 being interposed between the pin portions 40.

Figure 4:
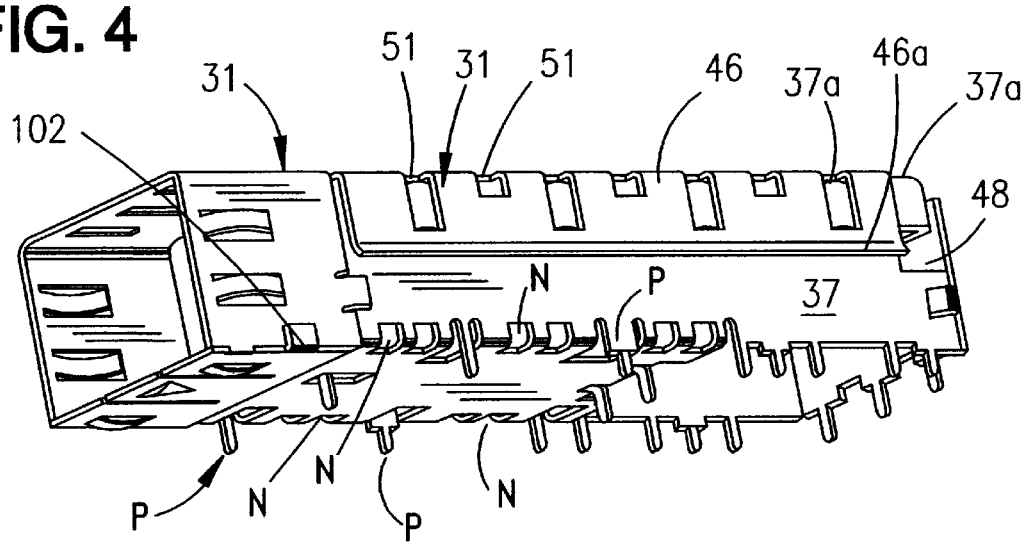
FIG. 4 is a perspective view of a shielding cage assembly of the present invention, but utilizing an alternate cage chassis.

In this manner, when two shield cages are mounted in a tandem, or "belly-to-belly" fashion on opposite sides of a circuit board 22, as best illustrated in FIG. 5, the mounting pin portions 40 of one shielding cage are received when the notches 42 of the opposing associated shielding cage. In this regard, the left sidewall of the chassis component will typically have a mounting pin portion 40 located near the chassis component front end, while the right sidewall will have a notch 42 located at its front end. Thus, the mounting pins and notches are staggered so that each mounting pin (designated as "P" in FIG. 4) on one of the sidewalls is associated with and preferably aligned with a corresponding width "N". (FIG. 4). Such arrangement benefits a circuit board designer because shielding cage assemblies may be mounted in exact alignment with each other on opposite sides of a circuit board 22, without requiring any of a circuit board 22, without requiring any of the cage assemblies to be offset from each other. Additionally, only one set of mounting holes, or vias 29, need be formed in the board, because the mounting pins will extend through the holes 29 and into an opposing notch 42. This relationship is illustrated in FIG. 6.

The standoff portions of the mounting pins may also be stamped from the sidewalls of the chassis component so that there is a 1 degree angle from the horizontal in an upward fashion. In this manner, the cage assembly is slightly tilted upwardly with respect to the circuit board (FIG. 6). This is done by providing the bottom edge 125 of the standoff portions 61 (FIG. 1) with an edge that is inclined upwardly with respect to the surface of the circuit board. 22.

The mounting pin portions of the cage assembly may very in configuration. In FIGS. 1 and 2, the mounting pin portions 40 have a thin pin 60 that extends from a standoff portion 61 that is wider than the pin and which serves to orient the cage bottom wall 35 at a specific height with respect to the top surface of the circuit board 22. In order to provide this standoff feature, the standoff portion 61 is separated from the rest of the cage chassis component 30 by slots 63.

Figure 10A:
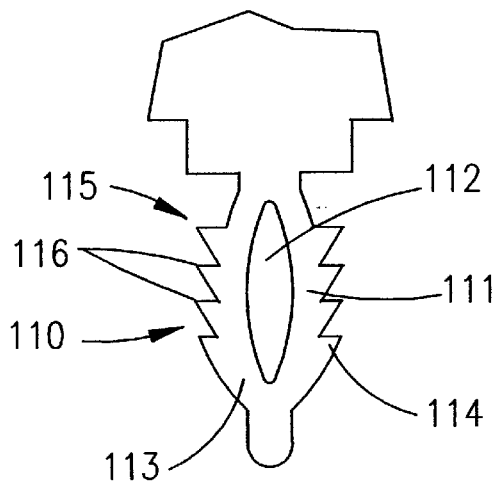
FIG. 10A is an enlarged detail view of an alternate, compliant mounting pin constructed in accordance with the principles of the present invention; and, FIG. 10B is an enlarged detail view of yet another style of compliant mounting pin constructed in accordance with the principles of the present invention.

Similarly, the cage chassis component 30 may utilize mounting pin portions that have no such standoff portions, but rather use only pins 70 of a preselected width as illustrated in FIG. 4. Yet another style of mounting pin is illustrated in FIG. 10A, wherein the mounting pin 110 has an enlarged body portion 111 that is wider than the diameter of the mounting hole into which it will be inserted. This body portion 111 includes a central opening 112 that defines a pair of compressible leg portions 113 that form the body portion 111 of the pin 110, which may be compressed into a mounting hole opening, typically in a direction toward each other. The legs portions 113 in this embodiment, as in the other described embodiments, will act cooperatively as a spring to exert and outward force on the mounting hole walls, which will serve to retain the mounting pins within their mounting holes. In order to assist this retention force, the leg portions may be provided with serrated edges 114 having a plurality on individual barbs 115, the tips 116 of which face upwardly to grip, or otherwise engage, the sidewalls of a mounting hole (not shown).

Figure 10B:
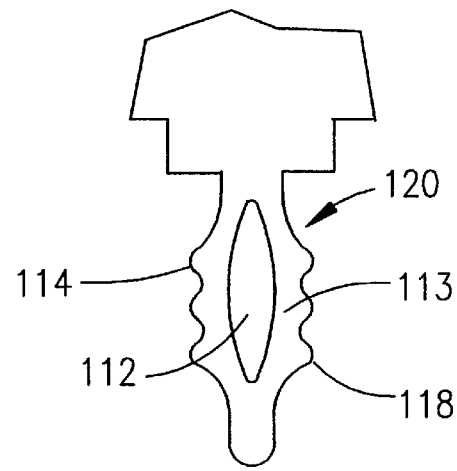

FIG. 10B illustrates another mounting pin embodiment 120 which is similar to the mounting pin 110 of FIG. 10A, but which differs in that instead of using serrations that are stamped or cut into the metal from which the cage chassis component 30 is made, the edges 114 are coined to form blunt projections 118, rather than the sharp barbs 115 of the pin of FIG. 10A. These coined edges will reduce the likelihood of the pin cutting into the mounting hole sidewall and generating shavings from the board which may interfere with the chassis component positioning on the circuit board.

Another style of mounting pin portion 40 is illustrated in the embodiment of the invention illustrated in FIGS. 5 and 6, wherein the mounting pin portions 40 take the form of compressible, press-fit pins 80 having openings formed therein which are known in the art as "eye of needle" pins. Each such eye of needle pin 80 has an elongated body portion 81 with an opening 82 stamped therein, and which terminates in a solid tip 83. The opening 82 formed in each pin 80 permits the body portion 81 to be made oversized for the circuit board mounting hole 29 so that it will collapse slightly upon itself but will collapse slightly itself but still extend a retention force on the circuit board hole 29 as it acts as a spring. With cages of the present invention, more effective shielding, especially EMI shielding and assembly is achieved while maintaining a small foot print (or form factor) on the circuit board.

While the preferred embodiment of the invention have been shown and described, it will be apparent to those skilled in the art that changes and modifications may be made therein without departing from the spirit of the invention, the scope of which is defined by the appended claims.

We claim:

1. A shielding cage for a transceiver, comprising:
an elongated body portion for mounting to a circuit board, the body portion including a plurality of walls that cooperatively define a channel extending longitudinally of said body portion, said body portion including a bottom wall and two sidewalls extending upwardly from the bottom wall, said body portion having a plurality of mounting pins formed therewith and extending therefrom, the mounting pins being received within mounting holes in said circuit board when said body portion is mounted to said circuit board, said body portion sidewalls including a plurality of retainer elements integrally formed therein, said retainer elements including arcuate engagement surfaces that are curved in a horizontal direction along said body portion sidewalls, the arcuate engagement surfaces extending outwardly with respect to said body portion sidewalls;
an elongated cover portion for covering said body portion channel, the cover portion including a top wall and two sidewalls spaced apart from each other and extending downward therefrom, the cover portion sidewalls having height dimensions which are less than corresponding height dimensions of said body portion sidewalls such that parts of said cover portion sidewalls overlie said body portion sidewalls when said cover portion is applied to said body portion, said cover portion further including a plurality of slots aligned with said body portion retainer elements, the slots being larger in size than said retainer elements such that said retainer elements are captured within said slots when said cover portion is fully engaged on said body portion, said cover portion sidewalls including leading edge portions which are flared outwardly with respect to said cover portions sidewalls, said leading edge portions directing said cover portion sidewalls over said body portion sidewalls when said cover portion is applied to said body portion.

2. The shielding cage as claimed in claim 1, wherein said mounting pins include standoff mounting pins, each of the standoff mounting pins including a pin portion for entry into a circuit board opening and a standoff portion that spaces said body portion bottom wall away from said circuit board when said body portion is mounted thereto, the standoff portion being wider than said pin portion.

3. The shielding cage as claimed in claim 1, wherein said body portion sidewalls include a plurality of U-shaped openings formed therein, the openings defining said retaining elements, each of said retaining elements having a free end that extends downwardly from a top of said opening, said free ends defining second engagement surfaces of said retaining elements, the second engagement surfaces defining stop surfaces which prevent said cover portion from inadvertent removal from said body portion.

4. The shielding cage as claimed in claim 3, wherein said retaining element free end is curved and has two spaced apart corner portions which are disposed within said openings.

5. The shielding cage as claimed in claim 1, wherein said mounting pins include elongated pin members that are larger in dimension than said circuit board mounting holes, so as to create an interference fit between said mounting pins and said circuit board openings.

6. The shielding cage as claimed in claim 5, wherein said pin member include compressible body portions.

7. The shielding cage as claimed in claim 6, wherein said compressible body portions include press-fit, eye of needle portions.

8. The shielding cage as claimed in claim 6, wherein said compressible body portions include serrated edges for gripping sidewalls of circuit board mounting holes.

9. The shielding cage as claimed in claim 8, wherein said serrated edges are formed by coining said compressible body portions.

10. The shielding cage as claimed in claim 1, wherein said body portion further includes a plurality of notches formed therein, the notches being at least equal in number to a number of said mounting pins, said notches being disposed on said body portion where said body portion bottom and sidewalls meet, said notches further extending upward into said sidewalls, said notches being dimensioned to receive a mounting pin therein from an opposing cage component mounted on an opposite side of a circuit board.

11. The shielding cage as claimed in claim 10, wherein said notches and said mounting pins are staggered in alignment along said body portion sidewalls, such that when two of said shielding cages are mounted to opposite surfaces of an intervening circuit board in alignment with each other, said mounting pins of one of said two shielding cages are received within said notches of the other of said two shielding cages.

12. A shielding cage for shielding an electronic component contained therein from electromagnetic interference, comprising:

an elongated body member for mounting the cage to a surface of a circuit board, the body member including a bottom wall and two sidewalls extending upwardly therefrom and terminating in free ends, the bottom and sidewalls cooperatively defining a channel extending longitudinally through said body member, the sidewall free ends defining two spaced apart leading edges of said body member, said body member including a plurality of pin members extending therefrom which are received within mounting holes disposed in a circuit board when said body member is mounted to said circuit board; and, an elongated cover member for closing off a top of said body member channel, the cover member and said body member cooperatively defining a hollow receptacle for receiving at least one electronic component therein, said cover member including a top wall and two sidewalls disposed along opposite sides of said cover member top wall and extending downward therefrom, said cover member sidewalls terminating in downwardly extending free ends, said free ends including flared leading edges that extend outwardly relative to both said body member sidewalls and said cover member sidewalls, said flared leading edges, facilitating engagement of said cover member to said body member by riding up said body member leading edges and over said body member sidewalls when said cover member is applied to said body member.

13. The shielding cage as claimed in claim 12, wherein said body member sidewalls include a plurality of U-shaped openings formed therein, each of the openings defining a retainer formed from said body member sidewalls, said cover portion sidewalls further including a plurality of slots, single ones of the slots being aligned with single ones of said retainers, the slots receiving said retainers therein when said cover member is fully engaged with said body member.

14. The shielding cage as claimed in claim 12, further including a plurality of standoff mounting pins formed on said body member for mounting said body member to said circuit board, each of the standoff mounting pins including a pin portion for entry into a circuit board opening and a standoff portion that spaces said body portion bottom wall away from said circuit board when said body portion is mounted thereto, said standoff portion being formed with an incline so as to tilt said chassis component upwardly with respect to a circuit board.

15. The shielding cage as claimed in claim 12, further including a plurality of mounting pins formed on said body member for mounting said body member to said circuit board, and wherein said body portion further includes a plurality of notches formed therein, the notches being at least equal in number to a number of said mounting pins, said notches being disposed on said body portion where said body portion bottom and sidewalls meet, said notches further extending upward into said sidewalls, said notches being dimensioned to receive a mounting pin therein.

16. The shielding cage as claimed in claim 12, wherein each retainer includes a body portion which extends downwardly in said U-shaped opening and which terminates in a free end, said free ends defining stop surfaces which prevent said cover member from inadvertent removal from said body member.

17. The shielding cage as claimed in claim 16, wherein said retainer body portions are curved in a horizontal direction along said body member sidewalls, and the curved body portions extending outwardly with respect to said body member sidewalls and presenting discrete curved surfaces of said cover member sidewalls which ramp said cover member sidewalls up and over said retainers when said cover member is fully engaged with said body member.

18. The shielding cage as claimed in claim 12, further including a plurality of mounting pins formed on said body member for mounting said body member to said circuit board, said mounting pins being larger than said mounting holes of said circuit board and having compressible body portions, so as to create an interference fit between said mounting pins and said circuit board mounting holes.

19. The shielding cage as claimed in claim 18, wherein said compressible body portions include press-fit, eye of needle portions.

20. The shielding cage as claimed in claim 18, wherein said compressible body portions include serrated edges for gripping said mounting holes.

* * * * *